United States Patent
Kotowski et al.

(10) Patent No.: US 8,049,551 B2
(45) Date of Patent: Nov. 1, 2011

(54) CHARGE PUMP FOR SWITCHED CAPACITOR CIRCUITS WITH SLEW-RATE CONTROL OF IN-RUSH CURRENT

(75) Inventors: Jeff Kotowski, Nevada City, CA (US); Shane Hollmer, Grass Valley, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 37 days.

(21) Appl. No.: 12/140,410

(22) Filed: Jun. 17, 2008

(65) Prior Publication Data

US 2009/0309633 A1  Dec. 17, 2009

(51) Int. Cl.
G05F 1/10  (2006.01)
(52) U.S. Cl. ......................... 327/536; 327/390
(58) Field of Classification Search .................. 327/306, 327/308, 312, 390, 536; 363/59–60; 307/110
See application file for complete search history.

(56) References Cited

U.S. PATENT DOCUMENTS

| | | | | |
|---|---|---|---|---|
| 4,481,566 A * | 11/1984 | Hoffman et al. | ................ | 363/60 |
| 5,093,586 A * | 3/1992 | Asari | ............................ | 327/530 |
| 5,546,031 A * | 8/1996 | Seesink | ......................... | 327/155 |
| 5,583,425 A * | 12/1996 | Rapp et al. | ..................... | 323/316 |
| 6,002,599 A * | 12/1999 | Chow | .............................. | 363/59 |
| 6,246,221 B1 * | 6/2001 | Xi | ................................... | 323/280 |
| 6,359,797 B1 * | 3/2002 | Bayer et al. | ..................... | 363/60 |
| 6,411,531 B1 * | 6/2002 | Nork et al. | ..................... | 363/60 |
| 6,452,440 B2 * | 9/2002 | Rapp | ............................. | 327/543 |
| 6,501,253 B2 * | 12/2002 | Marty | ............................ | 323/280 |
| 6,559,689 B1 * | 5/2003 | Clark | ............................. | 327/97 |
| 6,577,514 B2 * | 6/2003 | Shor et al. | ....................... | 363/59 |
| 6,737,845 B2 | 5/2004 | Hwang | | |
| 6,791,306 B2 * | 9/2004 | Walters et al. | ................ | 323/288 |
| 6,879,137 B2 * | 4/2005 | Sase et al. | ..................... | 323/282 |
| 6,977,490 B1 * | 12/2005 | Zhang et al. | ..................... | 323/280 |
| 7,102,419 B2 * | 9/2006 | Lou et al. | ....................... | 327/530 |
| 7,170,352 B1 * | 1/2007 | Caldwell | ...................... | 330/261 |
| 7,375,992 B2 * | 5/2008 | Mok et al. | ........................ | 363/60 |
| 7,411,799 B2 * | 8/2008 | Muggler et al. | ................ | 363/60 |
| 7,466,189 B2 * | 12/2008 | Sohara et al. | ................ | 327/536 |
| 7,482,872 B2 * | 1/2009 | Kapusta | ........................ | 330/253 |
| 7,746,676 B2 * | 6/2010 | Feng et al. | ....................... | 363/60 |
| 7,888,989 B2 * | 2/2011 | Lin et al. | ........................ | 327/536 |
| 2008/0030261 A1 * | 2/2008 | Nakata | ......................... | 327/536 |
| 2008/0284395 A1 * | 11/2008 | Wang et al. | ................... | 323/282 |

* cited by examiner

*Primary Examiner* — Thomas J Hiltunen
(74) *Attorney, Agent, or Firm* — Perkins Coie LLP

(57) ABSTRACT

A ramp-up circuit for switched capacitor circuits with negative feedback to control the slew rate of in-rush current. Other embodiments are described and claimed.

3 Claims, 3 Drawing Sheets

CHARGE PUMP FOR SWITCHED CAPACITOR CIRCUITS WITH SLEW-RATE CONTROL OF IN-RUSH CURRENT

FIELD

The invention relates to analog circuits, and more particularly to charge pumps for switched capacitor circuits.

BACKGROUND

Some prior art switched capacitor circuits may develop large spikes in the drain-source current of their switching transistors when the switching transistors are switched from OFF to ON. These drain-source currents are sometimes termed in-rush currents. Large spikes in these in-rush currents may contribute to unwanted EMI (Electromagnetic Interference) system noise. Reducing the slew rate of these in-rush currents in switched capacitor circuits may help mitigate EMI system noise.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
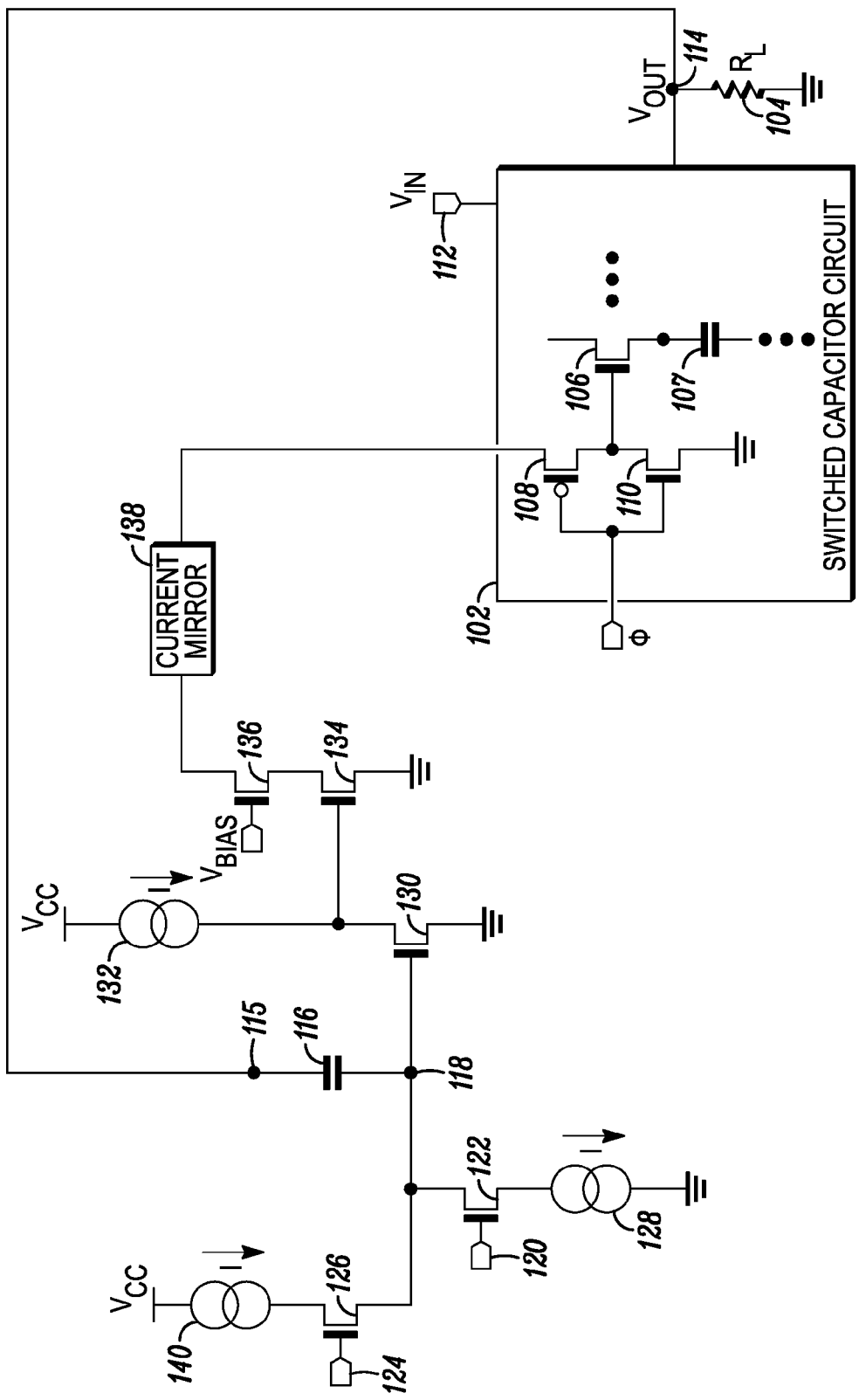
FIG. 1 illustrates a ramp-up circuit for a switched capacitor circuit according to an embodiment.

FIG. 1 is a schematic of a charge pump circuit for a switched capacitor circuit according to an embodiment. Switched capacitor circuit 102 represents any one of a large number of switched capacitor circuits well known to those skilled in the art of analog and digital circuits. Switched capacitor circuit 102 provides current to load 104 at some regulated output voltage, denoted as $V_{OUT}$. In practice, switched capacitor circuit 102 often comprises a number of switches (switching transistors), drivers for the switches, and one or more switched capacitors; and also other circuits, such as circuits for providing clock signals to the drivers. For ease of illustration, however, FIG. 1 shows only one nMOSFET (n-Metal-Oxide-Semiconductor-Field-Effect-Transistor) switching transistor, labeled 106, providing current to capacitor 107; and one driver, comprising pMOSFET 108 and nMOSFET 110, for driving the gate of switching transistor 106. Because in practice a number of capacitors are used in a typical switched capacitor circuit, for this description of the embodiments one may view switched capacitor circuit 102 as comprising a plurality of switching transistors and switched capacitors. The topology of the switched capacitors sets the gain of switched capacitor circuit 102. In FIG. 1, $\phi$ denotes the clock signal for clocking the driver comprising pMOSFET 108 and nMOSFET 110.

In some applications, switched capacitor circuit 102 may have more than one gain state. Gain may be defined as the ratio of output voltage $V_{OUT}$ to input voltage $V_{IN}$ (at input port 112) for the case of no load. In practice, the input voltage is the voltage of a source providing power to load 104 by way of switched capacitor circuit 102. For example, depending upon the way in which the capacitors in switched capacitor circuit 102 are coupled together during the charge phase and discharge phase, the voltage gain developed by switched capacitor circuit 102 may be a rational number belonging to a set of rational numbers, such as for example 1, 1.5, 2, etc.

By making use of negative feedback, the embodiment of FIG. 1 adjusts drain-source current through the source of pMOSFET 108 to control the slew rate of the drain-source current (the in-rush current) of switching transistor (nMOSFET) 106 when switched ON. This may be described as follows.

Feedback from output port 114 is provided to terminal (or node) 115 of capacitor 116. The other terminal of capacitor 116 is connected to node 118. When switched capacitor circuit 102 is first turned on, or when the gain of switched capacitor circuit 102 is increased from some rational gain value to a higher rational gain value, input port 120 connected to the gate of nMOSFET 122 is held HIGH so that nMOSFET 122 is ON, and input port 124 connected to the gate of nMOSFET 126 is held LOW (ground) so that nMOSFET 126 is OFF. For the moment, assume that no feedback is present so that capacitor 116 is not connected to node 118. With nMOSFET 122 ON, current source 128 pulls node 118 down to, or close to, ground. Eventually, current source 128 runs out of headroom and shuts down as node 118 is pulled close to ground. This brings the gate of nMOSFET 130 to ground, so that nMOSFET 130 is OFF. With nMOSFET 130 OFF, current source 132 pulls HIGH ($V_{CC}$) the gate of nMOSFET 134 so that nMOSFET 134 is completely ON. nMOSFET 136 is connected in series with nMOSFET 134, and its gate is biased to some bias voltage $V_{BIAS}$ in order to limit the drain-source current of nMOSFET 134 to some designed-for (specified) maximum current, $I_{MAX}$. The drain-source current through nMOSFET 134 and nMOSFET 136 is mirrored by current mirror 138 into the source of pMOSFET 108.

Note that the combination of nMOSFET 130, current source 132, and nMOSFET 134 serves the function of a transconductance amplifier with negative gain, where a decrease in the gate voltage of nMOSFET 134 is translated into a current increase at the drain of nMOSFET 134.

The maximum current $I_{MAX}$ is chosen so that when mirrored into the source of pMOSFET 108, switching nMOSFET 106 is switched completely ON and OFF by clock signal $\phi$, so that switched capacitor circuit 102 is completely ramped up to provide power to load 104.

Now consider the effect of the feedback provided by capacitor 116 connected to node 118. A sudden change in output voltage $V_{OUT}$, i.e., a non-zero time derivative of the output voltage, affects the total current sourced into node 118 because of capacitor 116. For ease of discussion, it is not necessary to distinguish between sourcing current and sinking current. As an example, although current source 128 may be properly termed a current sink that sinks current from node 118 when following the usual convention that current is the time-rate of positive charge, it is more convenient to simply refer to component 128 as a current source that sources current into node 118. Accordingly, one may view capacitor 116 as injecting current into node 118 that depends upon the time rate of change of the output voltage and the value of its capacitance, as well as other capacitances that may load node 118. The amount of injected current also depends upon the time rate of change of the voltage at node 118, but in general the relationship is such that an increase in output voltage (a positive time derivative of output voltage) injects a positive current into node 118, and a decrease in output voltage (a negative time derivative of the output voltage) injects a negative current to node 118, following the usual convention that current is the time-rate of positive charge.

Injecting current into node 118 contributes a positive or negative change to the gate voltage of nMOSFET 130, depending upon the sign of the injected current. That is, capacitor 116 injecting a positive current into node 118 contributes a positive change to the gate voltage of nMOSFET 130, whereas capacitor 116 injecting a negative current to node 118 contributes a negative change to the gate voltage of nMOSFET 130. Consequently, with the transconductance function provided by the combination of nMOSFET 130, current source 132, and nMOSFET 134, and with the relationship between the time rate of change of the output voltage and the current injected into node 118 by capacitor 116, a sudden increase in the output voltage contributes a decrease to the current provided to the drain of pMOSFET 108. Decreasing the current provided to pMOSFET 108 reduces the degree to which switching transistor 106 turns ON. This contributes a reduction to the drain-source current of switching transistor 106, which contributes a reduction to the in-rush current supplied to capacitor 107.

By similar reasoning as given above, a sudden decrease in the output voltage contributes an increase to the in-rush current supplied to capacitor 107. Consequently, the negative feedback provided by way of capacitor 116 connected to node 118 and output port 114 reduces the slew-rate of the in-rush current provided to capacitor 107.

Although slew rate is controlled as discussed above by the negative feedback provided by capacitor 116, superimposed upon the current injected into node 118 by capacitor 116 is the current injected into node 118 by current source 128. The result is a soft ramp-up for switched capacitor circuit 102 with the negative feedback contributing to a reduction in the slew rate of the in-rush current.

In some applications, it may be desirable during operation to test if the voltage gain of switched capacitor circuit 102 may be reduced so as to increase system power efficiency. This may be accomplished by bringing port 120 LOW to turn nMOSFET 122 OFF, and bringing port 124 HIGH to turn nMOSFET 126 ON. This allows current source 140 to inject positive current into node 118, thereby contributing to an increase in the gate voltage of nMOSFET 130. As a result, switched capacitor circuit 102 reduces the load current provided to load 104 to some specified value that may be set by current source 140, yet the feedback provided by capacitor 116 still controls the slew rate of the in-rush current. Once it is determined that the load may accept such a specified reduced current, then the gain state of switched capacitor circuit 102 may be lowered, port 124 may be brought LOW to turn nMOSFET 126 OFF, and port 120 may be brought HIGH to turn nMOSFET 122 back ON.

Figure 2:
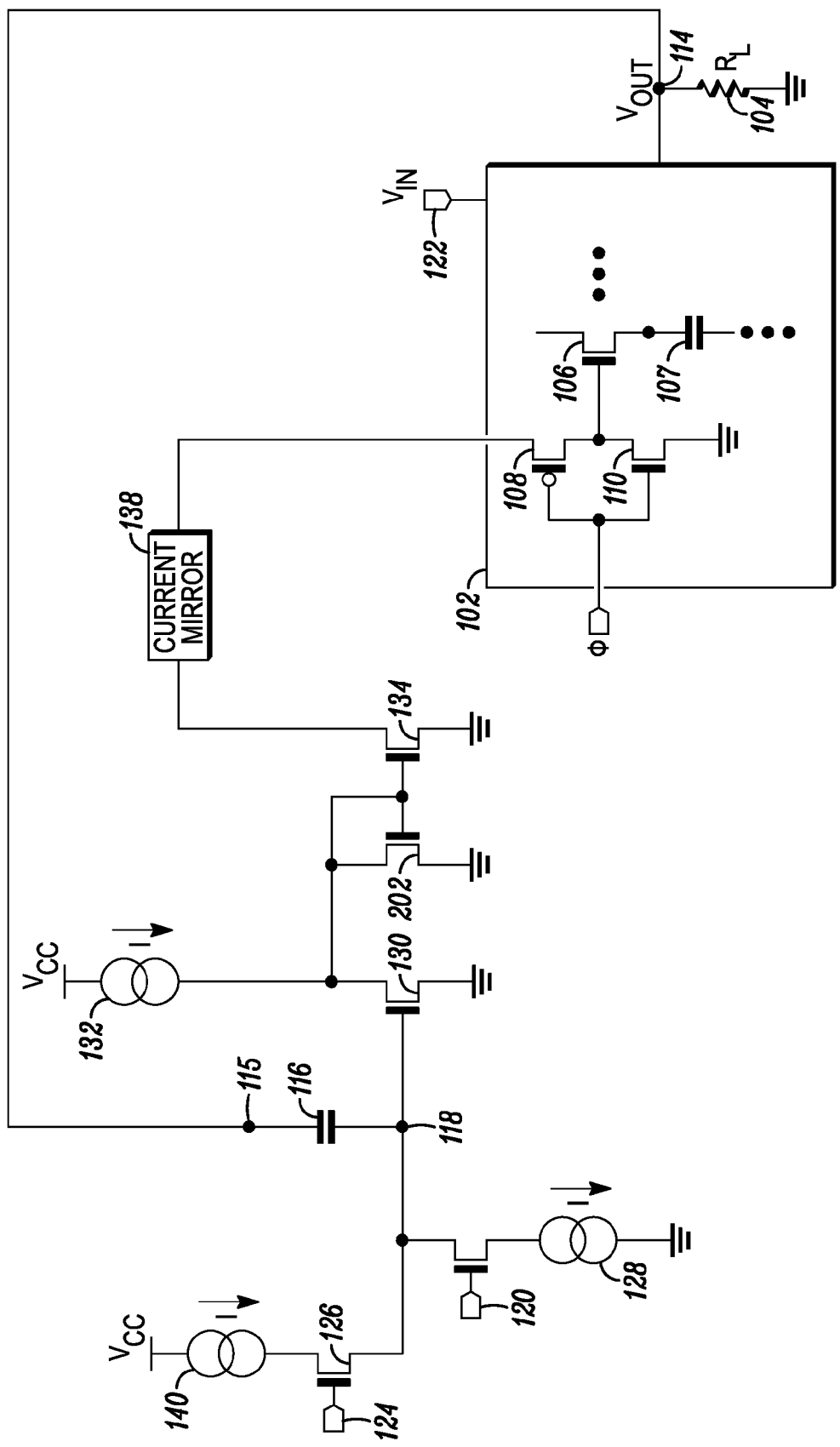
FIG. 2 illustrates a ramp-up circuit for a switched capacitor circuit according to another embodiment.

Various modifications may be made to the described embodiments without departing from the scope of the invention as claimed below. As an example, the maximum drain-source current $I_{MAX}$ through nMOSFET 134 may be set in various ways. One particular embodiment is illustrated in FIG. 2, comprising nMOSFET 202 with its gate connected to its drain and to the gate of nMOSFET 134. The combination of transistors 202 and 134 forms a current mirror. By properly sizing transistors 134 and 202, the maximum current $I_{MAX}$ may be set.

Figure 3:
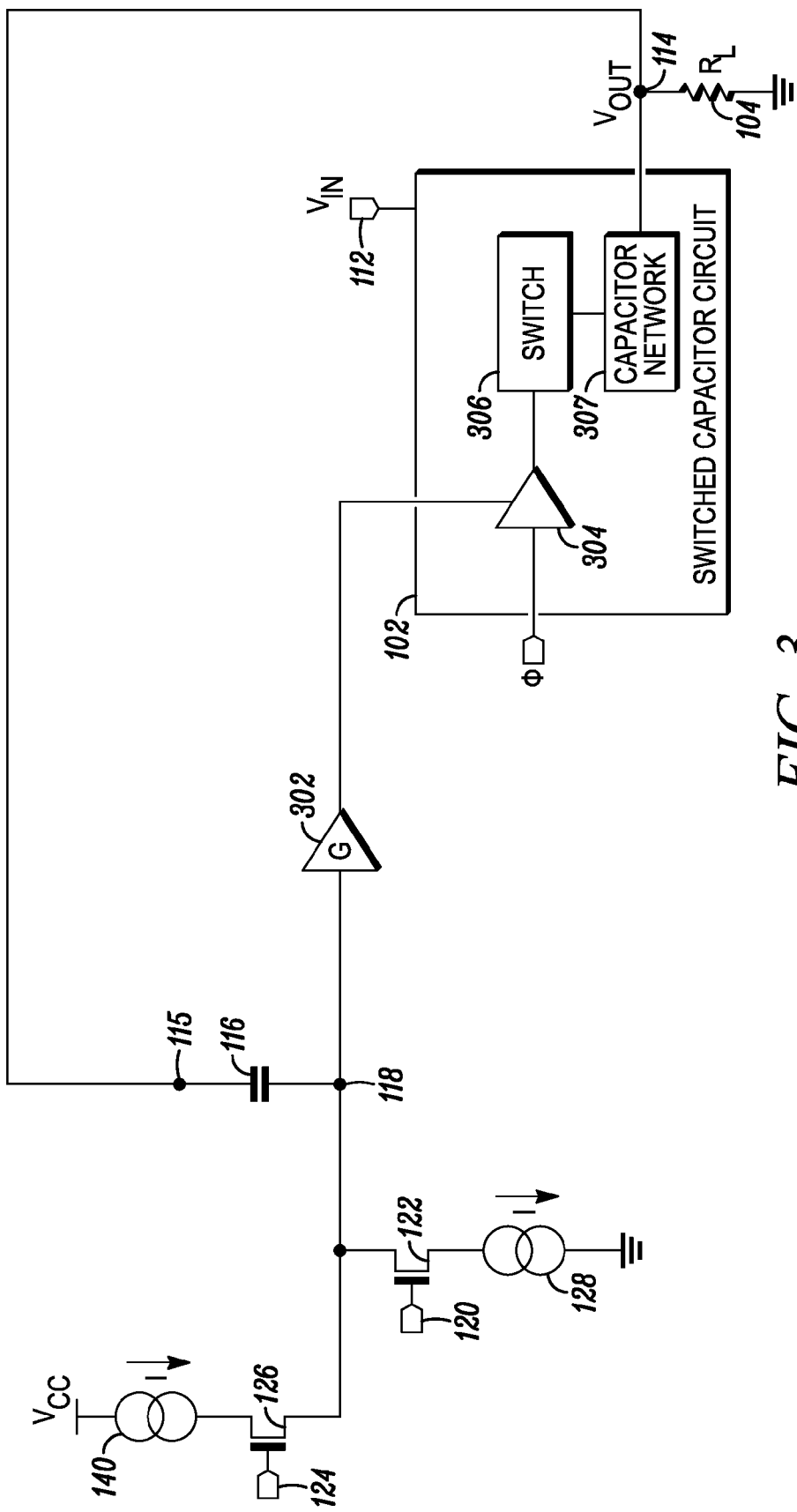
FIG. 3 illustrates a ramp-up circuit for a switched capacitor circuit according to another embodiment.

As another example, as discussed previously, the combination of nMOSFET 130, current source 132, and nMOSFET 134 serves the function of a transconductance amplifier with negative gain. Accordingly, the embodiments of FIGS. 1 and 2 may be abstracted as shown in FIG. 3, comprising transconductance amplifier 302. Transconductance amplifier 302 has a negative gain and sources current to driver 304 so that the combination of capacitor 116 and transconductance amplifier 302 provides a negative feedback loop realized in FIG. 1 by the combination of components 130, 132, 134, 136, and 138. (Note that the function of current mirror 138 is included in transconductance amplifier 302.) Driver 304 in FIG. 3 abstracts the combination of transistors 108 and 110 in FIG. 1, switch 306 abstracts switching transistor 106, and capacitor network 307 abstracts capacitor 107.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected together by an interconnect (transmission line). In integrated circuit technology, the interconnect may be exceedingly short, comparable to the device dimension itself. For example, the gates of two transistors may be connected together by polysilicon, or copper interconnect, where the length of the polysilicon, or copper interconnect, is comparable to the gate lengths. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

It is also to be understood in these letters patent that a "current source" may mean either a current source or a current sink. Similar remarks apply to similar phrases, such as, "to source current".

It is also to be understood in these letters patent that various circuit components and blocks, such as current mirrors, amplifiers, etc., may include switches so as to be switched in or out of a larger circuit, and yet such circuit components and blocks may still be considered connected to the larger circuit.

What is claimed is:
1. A switched capacitor circuit comprising:
an output port;
a switching transistor directly connected to at least one capacitor to provide current to the at least one capacitor when switched ON, the switching transistor comprising a gate;
a driver coupled to the gate of the switching transistor to switch the switching transistor ON and OFF;
a negative feedback loop coupled to the output port to provide current to the driver, comprising:
a node;
a feedback capacitor comprising a first terminal connected to the output port and a second terminal connected to the node; and
a transconductance amplifier having a negative gain, the transconductance amplifier comprising an input port connected to the node and an output port coupled to the driver; and
a current source to pull the node LOW when coupled to the node.
2. A switched capacitor circuit comprising:
an output port;

a switching transistor directly connected to at least one capacitor to provide current to the at least one capacitor when switched ON, the switching transistor comprising a gate;
a driver coupled to the gate of the switching transistor to switch the switching transistor ON and OFF, comprising:
a negative feedback loop coupled to the output port to provide current to the driver comprising:
a node;
a feedback capacitor comprising a first terminal connected to the output port and a second terminal connected to the node; and
a transconductance amplifier having a negative gain, the transconductance amplifier comprising an input port connected to the node and an output port coupled to the driver
wherein the driver comprises a pMOSFET including a source connected to the output port of the transconductance amplifier.

3. A circuit comprising:
a switched capacitor;
a switching transistor directly connected to the switched capacitor, the switching transistor comprising a gate;
a driver to switch the switching transistor ON and OFF, the driver comprising a transistor having a drain-source current;
an output port coupled to the switched capacitor;
a node;
a feedback capacitor comprising a first terminal connected to the output port and a second terminal connected to the node;
an additional transistor comprising a gate connected to the node, and comprising a drain;
a current source connected to the drain of the additional transistor; and
a current mirror coupled to the drain of the additional transistor to source the drain-source current.

* * * * *